(12) United States Patent
Sakai

(10) Patent No.: US 11,695,409 B2
(45) Date of Patent: Jul. 4, 2023

(54) DRIVE CIRCUIT OF POWER SEMICONDUCTOR ELEMENT

(71) Applicant: Mitsubishi Electric Corporation, Tokyo (JP)

(72) Inventor: Takuya Sakai, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 196 days.

(21) Appl. No.: 17/429,941

(22) PCT Filed: Mar. 16, 2020

(86) PCT No.: PCT/JP2020/011330
§ 371 (c)(1),
(2) Date: Aug. 11, 2021

(87) PCT Pub. No.: WO2020/209007
PCT Pub. Date: Oct. 15, 2020

(65) Prior Publication Data
US 2022/0190819 A1 Jun. 16, 2022

(30) Foreign Application Priority Data
Apr. 9, 2019 (JP) ................. 2019-073873

(51) Int. Cl.
*H03K 17/16* (2006.01)
*H02M 1/08* (2006.01)

(52) U.S. Cl.
CPC ............ *H03K 17/168* (2013.01); *H02M 1/08* (2013.01)

(58) Field of Classification Search
CPC .................................................. H03K 17/168
(Continued)

(56) References Cited

U.S. PATENT DOCUMENTS 6,614,633 B1 * 9/2003 Kohno ................ H01L 27/0266
361/111
2004/0095699 A1   5/2004 Kohno
(Continued)

FOREIGN PATENT DOCUMENTS

EP     3 319 400 A1   5/2018
JP     S63-164708 A   7/1988
(Continued)

OTHER PUBLICATIONS

Office Action dated Oct. 18, 2022 in Japanese Patent Application No. 2021-513533, 16 pages.
(Continued)

*Primary Examiner* — Tomi Skibinski
(74) *Attorney, Agent, or Firm* — Xsensus LLP

(57) ABSTRACT

A drive circuit of a power semiconductor element comprises a gate drive voltage generator to generate, based on an ON/OFF drive timing signal input to an input terminal, a gate drive voltage to be applied to a gate electrode of a switching element having the gate electrode for controlling a main current that flows between a first main electrode and a second main electrode, wherein the gate drive voltage generator includes a gate current limiting circuit in which a current limiter to limit a current and a voltage limiter to limit the magnitude of a voltage applied to both ends of the current limiter are connected in parallel.

19 Claims, 16 Drawing Sheets

(58) Field of Classification Search
USPC .......................................................... 327/109
See application file for complete search history.

(56) References Cited

U.S. PATENT DOCUMENTS

| | | | |
|---|---|---|---|
| 2004/0212419 | A1 | 10/2004 | Tihanyi |
| 2010/0265746 | A1 | 10/2010 | Ishikawa et al. |
| 2016/0352321 | A1 | 12/2016 | Yamaguchi |
| 2018/0192490 | A1 | 7/2018 | Gotou et al. |

FOREIGN PATENT DOCUMENTS

| | | |
|---|---|---|
| JP | 2001-044291 A | 2/2001 |
| JP | 2010-252568 A | 11/2010 |
| JP | 2012-147591 A | 8/2012 |
| JP | 2013-229654 A | 11/2013 |
| JP | 2015-154591 A | 8/2015 |
| JP | 2015-204661 A | 11/2015 |
| JP | 2016-40967 A | 3/2016 |
| JP | 2016077057 A | 5/2016 |
| JP | 2018-88581 A | 6/2018 |

OTHER PUBLICATIONS

European Search Report dated Apr. 22, 2022, in European Patent Application No. 20788086.5.
Indian Office Action dated Mar. 10, 2022, in Indian Application No. 202127039410.
International Search Report and Written Opinion dated Jun. 2, 2020, received for PCT Application PCT/JP2020/011330, Filed on Mar. 16, 2020, 10 pages including English Translation.

* cited by examiner

EXAMPLE of TRANSFER CHARACTERISTICS of IGBT

EXAMPLE of TEMPERATURE COEFFICIENT of
BREAKDOWN VOLTAGE of ZENER DIODE

DRIVE CIRCUIT OF POWER SEMICONDUCTOR ELEMENT

CROSS-REFERENCE TO RELATED APPLICATIONS

The present application is based on PCT filing PCT/JP2020/011330, filed Mar. 16, 2020, which claims priority to JP 2019-073873, filed Apr. 9, 2019, the entire contents of each are incorporated herein by reference.

TECHNICAL FIELD

The present application relates to a drive circuit of a power semiconductor element.

BACKGROUND ART

A power converter for driving an electric motor such as an inverter performs power conversion by switching operation of a switching element which is a power semiconductor element. With regard to the driving of the switching element, even if the same state in a drive circuit is maintained, the switching state changes depending on a current value, etc., at the time of switching, and thus it is necessary to design the drive circuit with a margin considered. In order to solve the above problem and reduce a loss and noise, it is necessary to control a trade-off with respect to the loss, the noise or a spike voltage generated at the time of switching by the drive circuit. In order to improve the trade-off, it is necessary to control a gate current at the time of switching, control a gate voltage waveform in accordance with transfer characteristics of the switching element when the switching state, for example, the current value at the time of switching changes, and control the change of the gate current.

CITATION LIST

Patent Document

Patent Document 1: Japanese Patent Application Laid-open No. 2013-229654

SUMMARY OF INVENTION

Problems to be Solved by Invention

In order to switch a gate resistor or a power supply to control the gate current, multiple signals and switches are required to adjust a timing, which complicates the control circuit. In Patent Document 1, the gate voltage is controlled to switch to a threshold voltage or a set constant voltage at the beginning of the switching. However, when the temperature of the element or the current value at the time of switching changes, the characteristics of the element change, and the magnitude of the gate voltage required to be set changes, thereby limiting a reduction of a delay time at the time of switching. In addition, a dead time is required to prevent short circuit from occurring due to the delay time at the time of turning off, and it is necessary to turn off the switching element without fail within the dead time. In addition, a rise-time of the gate voltage is limited when an overcurrent occurs at the time of turning on, and thus the switching element operates in the active area for a long period, so that the loss of the switching element increases, and as a result, large heat radiating fins are required to prevent excessive temperature rise.

The present application discloses technology to solve the above problems, and an object thereof is to provide a drive circuit of a power semiconductor element with little switching loss or noise change without complicated control against changes in the current value or in the temperature of the switching element.

Means for Solving Problems

A drive circuit of a power semiconductor element disclosed in the present application includes a gate drive voltage generator to generate, based on an ON/OFF drive timing signal input to an input terminal, a gate drive voltage to be applied to a gate electrode of a switching element having the gate electrode for controlling a main current that flows between a first main electrode and a second main electrode, wherein the gate drive voltage generator includes a gate current limiting circuit in which a current limiter to limit a current and a voltage limiter to limit a magnitude of a voltage applied to both ends of the current limiter are connected in parallel.

Effect of Invention

According to the drive circuit of the power semiconductor element disclosed in the present application, the drive circuit of the power semiconductor element can be brought into reality with little switching loss or noise change without complicated control for changes in the current value or the temperature of the switching element.

MODES FOR CARRYING OUT INVENTION

Embodiment 1

Figure 1:
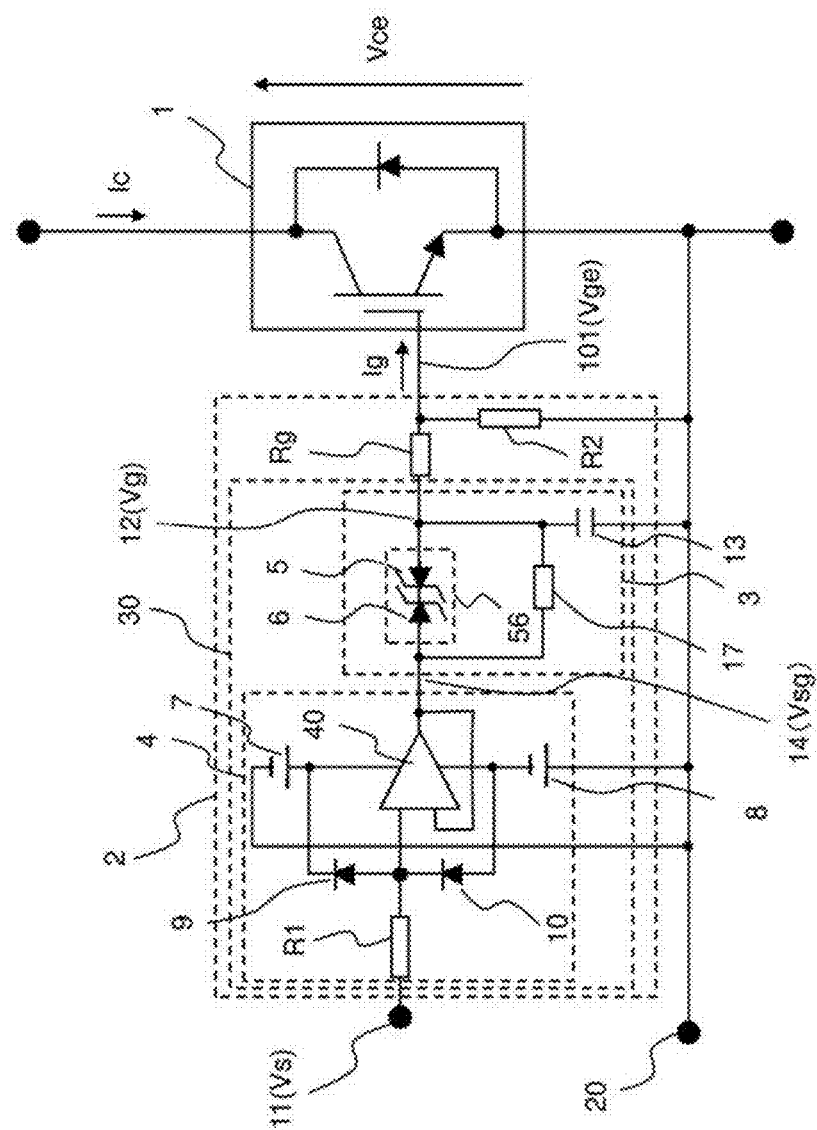
FIG. 1 is a circuit diagram showing a configuration of a drive circuit of a power semiconductor element according to Embodiment 1.

FIG. 1 is a circuit diagram showing a drive circuit of a power semiconductor element according to Embodiment 1. In the present application, an example will be described in which a switching element 1 is an insulated gate bipolar transistor (IGBT) as a power semiconductor element. The IGBT has a collector electrode (also called simply a collector) as a first main electrode and an emitter electrode (also called simply an emitter) as a second main electrode, and a current flowing between the collector and the emitter is controlled by a voltage applied to a gate electrode. The technology disclosed in the present application is not limited to the IGBT as the switching element, but can also be applied to other switching elements such as a metal-oxide semiconductor field-effect transistor (MOSFET), etc. which are configured to control the current flowing between two main electrodes, i.e., the first main electrode and the second main electrode, by the voltage applied to the gate electrode.

A drive circuit 2 of the power semiconductor element according to Embodiment 1 controls a voltage Vge of a gate terminal 101 by charging and discharging charges of the gate electrode in response to a drive timing signal input from an input terminal 11 in order to turn the switching element 1 on and off. A gate drive voltage generator 30 of the drive circuit 2 includes a gate current limiting circuit 3 and a drive voltage amplitude limiting circuit 4. The drive voltage amplitude limiting circuit 4 includes a first control power supply 7, a second control power supply 8, diodes 9 and 10 for limiting the amplitude of the input signal within the amplitudes of the first control power supply 7 and the second control power supply 8, a resistor R1 for limiting an input current, and a buffer circuit 40 for receiving a drive timing signal Vs and amplifying the signal. In addition, the drive circuit 2 is provided with a gate resistor Rg and a discharge resistor R2 on an output side. The gate current limiting circuit 3 is disposed between the drive voltage amplitude limiting circuit 4 and the gate terminal 101 of the switching element 1, and includes a current limiter 17 for limiting the gate current, a voltage limiter 56 connected in parallel with the current limiter 17, and a capacitor 13 (hereinafter referred to as a gate capacitance adjuster) for adjusting the gate current of the switching element 1 in response to two outputs of the current limiter 17 and the voltage limiter 56. Here, the current limiter 17 is a resistor.

The drive timing signal Vs is input between the input terminal 11 and an emitter terminal 20 which has a potential common with a potential of the emitter electrode serving as the second main electrode, and by the drive voltage amplitude limiting circuit 4, a voltage Vsg that is converted into an amplitude of voltage in the first control power supply 7 and the second control power supply 8 and is output from the drive voltage amplitude limiting circuit 4. Here, in the drive voltage amplitude limiting circuit 4, since the diode 9, the diode 10 and the resistor R1 on the input side are provided, even when the amplitude of the drive timing signal Vs inputted to the input terminal 11 is larger than that of the first control power supply 7 and the second control power supply 8, the magnitude of the voltage inputted to the buffer circuit 40 is limited to protect the buffer circuit 40. As the buffer circuit 40, an amplifier such as an operational amplifier or an amplifier circuit using a transistor can be used.

The voltage limiter 56 is constituted by a serially connected member in which two Zener diodes 5 and 6 are connected in series with their polarities reversed so as to limit a range of the voltage applied to both ends of the current limiter 17. The output of the gate drive voltage generator 30 is connected to the gate terminal 101 via the gate resistor Rg. The discharge resistor R2 is connected between the gate electrode and the emitter electrode.

By limiting the current, the current limiter 17 limits the amount of change in a potential at a connection point 12 between the current limiter 17 and the voltage limiter 56, namely, the potential Vg of the output of the gate drive voltage generator 30. Further, the voltage limiter 56 limits a range of the voltage in which the current limiter 17 limits the current. In Embodiment 1, as the voltage limiter 56, the two Zener diodes 5 and 6 are connected in series with their polarities reversed. With this configuration, when a potential difference exceeding a breakdown voltage in the Zener diodes 5 and 6 is generated between an input side and an output side of the gate current limiting circuit 3, the gate capacitance adjuster 13 is steeply charged by the voltage limiter 56. In Embodiment 1, the breakdown voltage in the case where the current flows from the input side to the output side of the gate current limiting circuit 3, that is, the breakdown voltage of the Zener diode 5, is Vz_5, and the breakdown voltage in the case where the current flows from the output side to the input side of the gate current limiting circuit 3, that is, the breakdown voltage of the Zener diode 6, is Vz_6.

Figure 2:
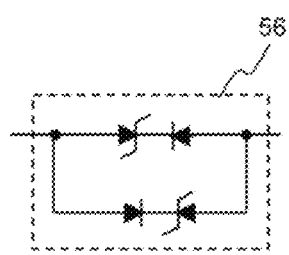
FIG. 2 is a circuit diagram showing another example of a voltage limiter of the drive circuit of the power semiconductor element according to Embodiment 1.

In Embodiment 1, as the voltage limiter 56, the Zener diode 5 and the Zener diode 6 are connected in series with their polarities reversed, and thus the voltage can be limited in either direction of the current direction. As shown in FIG. 2, the voltage can be limited in either direction of the current also by the voltage limiter 56 in which two of the serially connected member in which a Zener diode and a diode are connected in series with their polarities reversed are connected in parallel in the opposite direction to each other are used. However, the configuration shown in FIG. 1, in which the two Zener diodes are connected in series with their polarities reversed is simpler. Further, as will be described later, the voltage limiter 56 is preferably disposed in the same module as the switching element 1 or in the same substrate so as to have an equivalent temperature as the switching element 1, and the configuration of the voltage limiter shown in FIG. 1 is an effective configuration for this purpose.

In the circuit shown in FIG. 1, the gate capacitance adjuster 13 and the gate resistor Rg are connected in order to limit the magnitude of the gate current, but these two are not always necessary, and either one of them may not be provided. Further, when a constant on the chip or in the element of the switching element 1 is available, both may not be provided.

Figure 3:
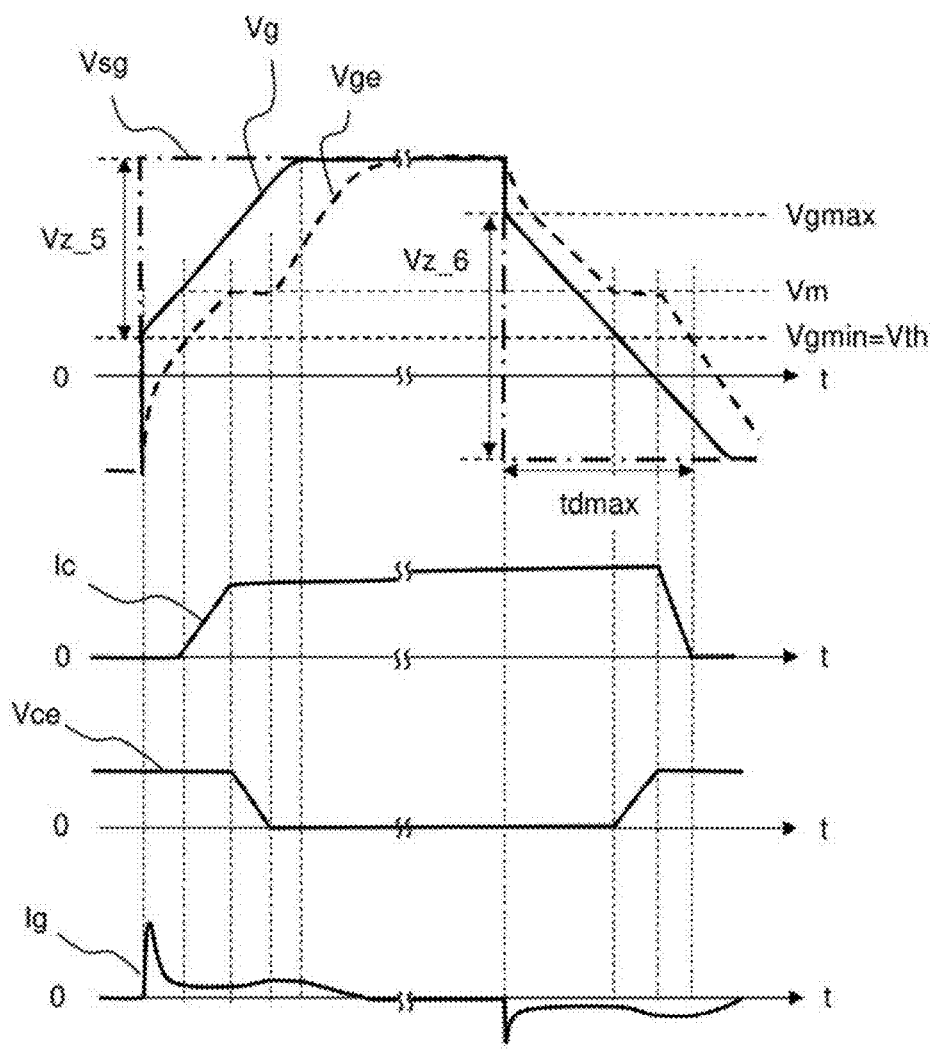
FIG. 3 is a diagram for describing operation of the drive circuit of the power semiconductor element according to Embodiment 1.

FIG. 3 is a diagram showing changes over time in the voltage and the current of each part for describing operation of the circuit shown in FIG. 1. In the uppermost part of the diagram, a dashed-dotted line indicates the potential Vsg at an output point 14 of the drive voltage amplitude limiting circuit 4, that is, at the input side of the gate current limiting circuit 3, a solid line indicates the potential Vg of the output of the gate drive voltage generator 30, and a broken line indicates the voltage between the gate electrode and the emitter electrode of the switching element 1, that is, the gate voltage Vge, and they are shown as the potential of the emitter terminal 20 of the switching element 1 in each case being zero. The second part of the diagram indicates a current flowing between the collector as the first main electrode and the emitter as the second main electrode of the switching element 1, that is, a collector current Ic, the third part thereof indicates a collector-emitter voltage Vce of the switching element 1, and the fourth part thereof indicates a gate current Ig of the switching element 1.

When an ON signal as the drive timing signal is input to the input terminal 11, the potential Vsg corresponding to the voltage of the first control power supply 7 is output to the input side of the gate current limiting circuit 3, that is, the output point 14 of the drive voltage amplitude limiting circuit 4, as shown by the dashed-dotted line. A value obtained by subtracting the breakdown voltage Vz_5 of the Zener diode 5 from the voltage of the first control power supply 7 that is the potential at the input side of the gate current limiting circuit 3 when the drive timing signal is at the ON time is defined as the first threshold voltage Vgmin, and the value of Vz_5 is set so that Vgmin becomes a threshold voltage Vth of the switching element 1. With this setting, at the time of rising of the drive timing signal, the potential Vg of the output of the gate drive voltage generator 30 rises through the Zener diode 5 and the Zener diode 6 up to a potential not exceeding the threshold voltage Vth of the switching element 1, as shown by the solid line. That is, when the potential Vg of the output of the gate drive voltage generator 30 reaches the first threshold voltage Vgmin, the potential difference between the input side and the output side of the gate current limiting circuit 3 becomes equal to or lower than the voltage Vz_5 set by the Zener diode 5, so that the Zener diode 5 and the Zener diode 6 of the voltage limiter 56 are turned off and the gate capacitance adjuster 13 is charged through the current limiter 17. At this time, the change in the potential Vg of the output of the gate drive voltage generator 30 is limited by a time constant of the current limiter 17 composed of a resistor, and the gate capacitance adjuster 13. When the gate voltage Vge becomes equal to or higher than the threshold voltage Vth, lagging behind the potential Vg of the output of the gate drive voltage generator 30, the switching element 1 starts to turn on, and when the gate voltage Vge rises, the current Ic to be transmitted increases, and when the current Ic reaches a required value, the switching element 1 shifts into the mirror period. As described above, when the drive timing signal is turned into the ON signal, that is, when the drive timing signal is turned on, no current flows in the current limiter 17 when the output voltage Vg of the gate drive voltage generator 30 is equal to or lower than the first threshold voltage Vgmin, and when the output voltage Vg becomes equal to or higher than the first threshold voltage Vgmin, the voltage limiter 56 limits the voltage across the current limiter 17 so that the current limiter 17 should limits the current. Thus, when the drive timing signal is turned into the ON signal, the voltage limiter 56 makes the output voltage Vg of the gate drive voltage generator 30 rise to the first threshold voltage Vgmin, and after Vg rises to the first threshold voltage Vgmin, Vg is raised by the current flowing through the current limiter 17.

The mirror period is a period in which Vce of the switching element 1 changes, and the rate of change dVce/dt depends on the magnitude of the gate current (hereinafter referred to as a mirror current) in the mirror period. The gate voltage during the mirror period (hereinafter referred to as mirror voltage Vm) is constant, and the value of Vm changes depending on the magnitude of the current Ic at the time of switching and the temperature of the element in accordance with the transfer characteristics of the switching element. However, since the rate of change dVg/dt of the potential Vg that is the output from the gate drive voltage generator 30 is limited by the current limiter 17, the rate of change of the voltage difference between the mirror voltage Vm and the voltage Vg that is the output from the gate drive voltage generator 30 does not change even if the switching current or the element temperature changes. Therefore, since the magnitude of the gate current during the mirror period does not change even if Vm changes, the collector-emitter voltage Vce of the switching element 1 is controlled such that the rate of change thereof is constant.

In the above description, the first threshold voltage Vgmin is equal to the threshold voltage Vth of the switching element 1, but the first threshold voltage Vgmin may not necessarily be equal to the threshold voltage Vth and may be set higher than the threshold voltage Vth. Alternatively, even if the first threshold voltage Vgmin is set lower than the threshold voltage Vth, the operation is possible, but the a delay time at the time of rising is increased. Therefore, in order to reduce the switching delay, the first threshold voltage Vgmin is preferably set to a voltage value equal to or higher than the threshold voltage Vth. In contrast, when the first threshold voltage Vgmin is set lower than the threshold voltage Vth, the rate of change di/dt of the current immediately after the start of the flow of the switching current can be suppressed to be small. Therefore, a recovery current at the time of switching can be suppressed to be small, and the generated noise can be suppressed to be small. Further, since Vg rises only up to a voltage value equal to or lower than the threshold voltage Vth, there is also an effect that the dVge/dt in the vicinity of the threshold voltage can be suppressed to a small value.

At the OFF time, that is, at the time of falling of the drive timing signal, a current flows from the output side to the input side in the gate current limiting circuit 3 in order to discharge electric charges from the gate electrode and the gate capacitance adjuster 13. Therefore, the potential difference between the output side and the input side of the gate current limiting circuit 3 is limited to the breakdown voltage Vz_6 of the Zener diode 6 of the voltage limiter 56. The breakdown voltage Vz_6 of the Zener diode 6 is set to a value of the voltage difference between a gate voltage Vgmax and the output voltage Vsg of the drive voltage amplitude limiting circuit 4 at the OFF time of the drive timing signal, the gate voltage Vgmax being obtained from the transfer characteristics of the switching element 1 corresponding to a maximum current value Icmax allowable in the switching element 1. With this setting, at the time of falling of the drive timing signal, the potential Vg of the output of the gate drive voltage generator 30 instantaneously becomes Vgmax corresponding to the maximum current value allowable in the switching element 1. In the present application, Vgmax is also referred to as a second threshold voltage.

After the potential Vg of the output of the gate drive voltage generator 30 becomes Vgmax, the Zener diode 5 and the Zener diode 6 of the voltage limiter 56 are turned off, so that the charges of the gate electrode and the gate capacitance adjuster 13 are discharged through the current limiter 17. At this time, dVg/dt, the rate of change of Vg, is limited by the time constant of the current limiter 17 and the gate capacitance adjuster 13. When the gate voltage Vge becomes the mirror voltage Vm, the switching element 1 shifts into the mirror period, but since dVg/dt is limited by the current limiter 17 as in the case at the ON time, the gate current in the mirror period is controlled so as not to greatly change even if the current value and the element temperature of the switching element at the time of switching change. Even if the gate voltage Vge becomes equal to or lower than Vm, the rate of change dVge/dt of the gate voltage Vge is controlled by the potential Vg of the output of the gate drive voltage generator 30, so that the magnitude of di/dt of the current Ic at the time of switching is limited. Since di/dt of the switching element 1 is limited, the recovery noise is controlled so as not to greatly change when the recovery current flows through the diode of the switching element 1. As described above, when the drive timing signal is turned into an OFF signal, that is, at the OFF time, the voltage limiter 56 limits the voltage at both ends of the current limiter 17 such that the current is limited by the current limiter 17 at the output voltage Vg of the gate drive voltage generator 30 that is less than or equal to the second threshold voltage Vgmax. Thus, when the drive timing signal becomes the OFF signal, the voltage limiter 56 lowers the output voltage Vg of the gate drive voltage generator 30 to the second threshold voltage Vgmax, and the after Vg is lowered to the second threshold voltage Vgmax, Vg is lowered by the current flowing through the current limiter 17.

Figure 4:
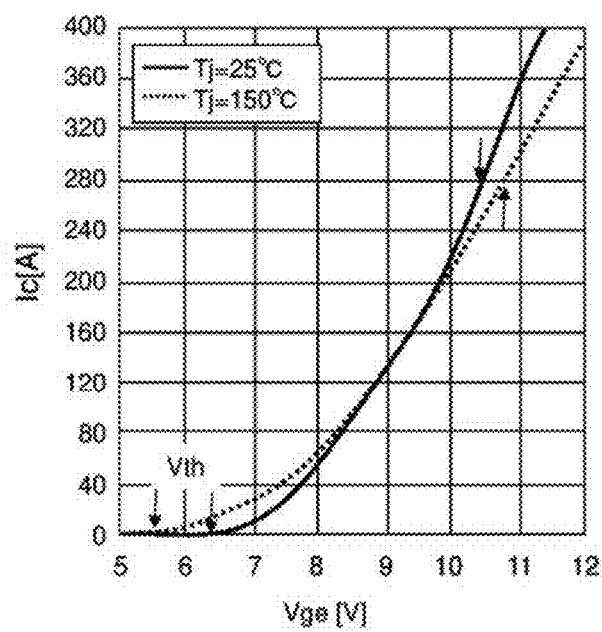
FIG. 4 is a diagram showing an example of temperature characteristics of an insulated gate bipolar transistor (IGBT).
Figure 5:
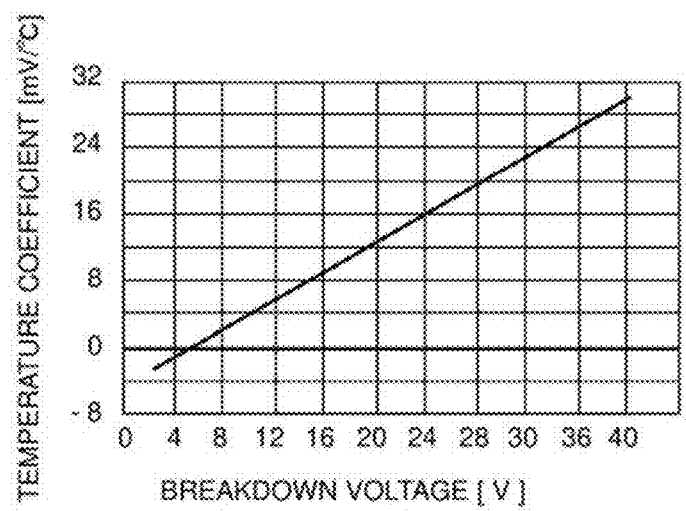
FIG. 5 is a diagram showing an example of a temperature coefficient of a breakdown voltage of a Zener diode.

Operation of the switching element 1 when the temperature thereof changes will be described. FIG. 4 shows transfer characteristics at different temperatures when the switching element 1 is an IGBT. As shown in FIG. 4, the threshold voltage Vth of the switching element 1 changes to a lower voltage as the element temperature increases. Even if the temperature rises, in order for a range of the gate voltage Vge in which the switching element 1 can flow the current does not deviate from a voltage range in which the rate of change dVg/dt of the potential Vg at the output of the gate drive voltage generator 30 is limited, an adjustment is required such that the voltage range limited changes on a lower voltage side. This adjustment of the voltage range can be done by using temperature characteristics of the breakdown voltage of the Zener diode. A Zener diode with a breakdown voltage Vz_5 of 5.6 V or higher is used as the Zener diode 5 for using the temperature characteristics. FIG. 5 shows the temperature characteristics of a Zener diode, i.e., the relationship between the breakdown voltage of the Zener diode and the temperature coefficient of the breakdown voltage (the rate of change of the breakdown voltage with respect to temperature change). As shown in FIG. 5, for a Zener diode with the breakdown voltage of 5.6 V or higher, the temperature coefficient of the breakdown voltage is positive. For this reason, the first threshold voltage Vgmin, which is the value obtained by subtracting the breakdown voltage Vz_5 of the Zener diode 5 from the value of the potential of the output point 14 of the drive voltage amplitude limiting circuit 4 when the drive timing signal is at the ON time, naturally changes to a lower value as the temperature rises. In other words, the change in the first threshold voltage Vgmin with temperature has the same tendency as the change in Vth with temperature. If a large temperature difference between the switching element 1 and the Zener diode 5 is avoided, even if Vth of the switching element 1 decreases due to a temperature rise, the breakdown voltage Vz_5 becomes large and Vth does not deviate from the voltage range where the gate voltage is controlled. When the change in the breakdown voltage with temperature do not match the change in Vth of the switching element 1 in the case with only one Zener diode 5, a configuration in which multiple Zener diodes in different breakdown voltage are connected in series as the Zener diode 5 can be used to adjust the temperature characteristics of the Zener diode 5 so as to match the change in Vth with temperature.

Next, the operation at the OFF time will be described. In the following, as an example, a case is assumed in which the signal is turned off at 280 amperes (A). In a large current range such as 280 A, the mirror voltage Vm rises as the element temperature rises, while the threshold voltage Vth falls. Therefore, if the second threshold voltage Vgmax is not changed when the temperature changes, the delay time shown by tdmax in FIG. 3 increases. To suppress the increase of the delay time, the second threshold voltage Vgmax should be increased as the temperature rises. By using the temperature characteristics of the breakdown voltage of the Zener diode, the second threshold voltage Vgmax can be made to increase as the temperature rises. A Zener diode with a positive temperature coefficient is used for the Zener diode 6. Since a Zener diode with a breakdown voltage of 5.6 V or higher have a positive temperature coefficient of the breakdown voltage, it has characteristics such that the breakdown voltage rises as the temperature rises. As a result, when the temperature rises, the breakdown voltage of the Zener diode 6 rises, which naturally increases the value of the second threshold voltage Vgmax, and thereby the increase of the drive delay time tdmax is suppressed.

In the present embodiment, the voltage limiter 56 composed of the Zener diode 5 and the Zener diode 6 is preferably mounted in the same module or on the same cooling base plate so as to have the same temperature as that of the switching element 1. However, even if the voltage limiter 56 is not mounted in the same module or on the same cooling base plate, as the switching element 1, the voltage limiter 56 may be mounted in the vicinity thereof. If the voltage limiter 56 is mounted in the vicinity of a module, etc. in which the switching element 1 is mounted, the temperature of the voltage limiter 56 also rises when the temperature of the switching element 1 rises due to the ambient temperature of the module or the cooling base plate. In this way, by disposing the voltage limiter 56 at a position where the environment regarding the temperature change of the voltage limiter 56 is the same as the environment regarding the temperature change of the switching element 1, both of the tendency of the temperature change is the same. If the temperature change of the voltage limiter 56 is smaller than the temperature change of the switching element 1, for example, a plurality of Zener diodes may be formed in series to adjust the temperature change characteristics, or a Zener diode in which Vz_5 and Vz_6 greatly change with a slight temperature change may be selected. In this way, by adjusting the temperature characteristics of the voltage limiter 56 in consideration of the difference in the temperature change between the switching element 1 and the voltage limiter 56, it is possible to prevent the control range of the dVge/dt from deviating from the operating range of the switching element 1.

As described above, according to the drive circuit of the power semiconductor element of Embodiment 1, even if the temperature or the current value of the switching element changes, the control range of the dVge/dt naturally changes without performing complicated control, so that the fluctuation in the switching operation is small. Therefore, for example, a dead time margin can be reduced, and thus the drive circuit of the power semiconductor element with little switching loss change or noise change can be implemented.

Embodiment 2

Figure 6:
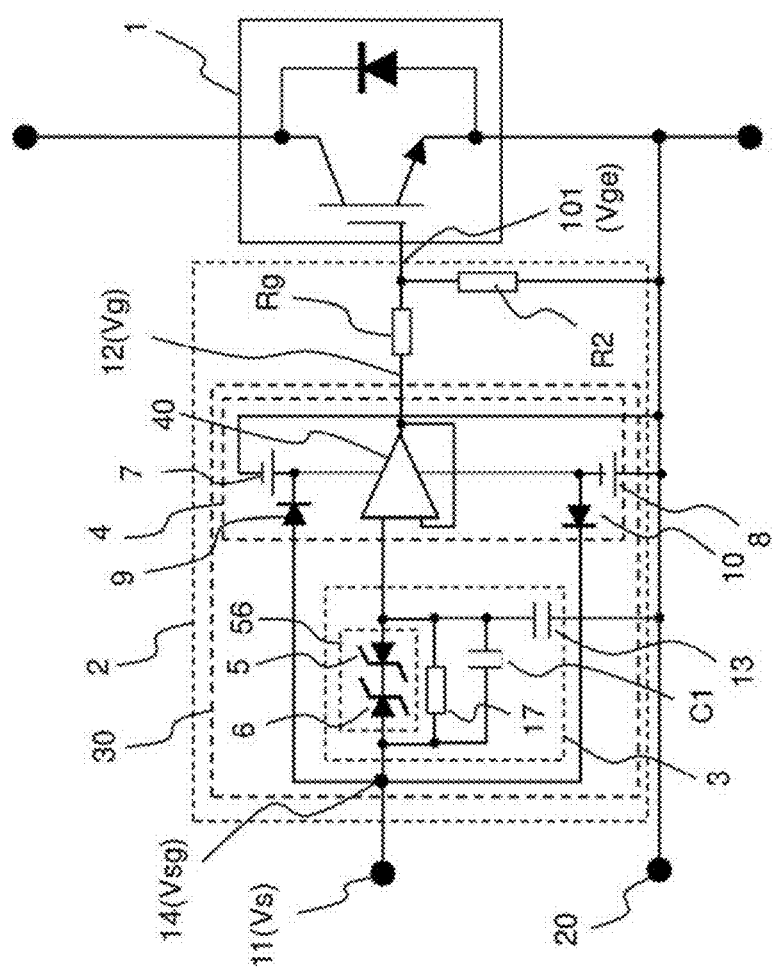
FIG. 6 is a circuit diagram showing a configuration of a drive circuit of a power semiconductor element according to Embodiment 2.

FIG. 6 is a circuit diagram showing a configuration of a drive circuit of a power semiconductor element according to Embodiment 2. The present embodiment is different from Embodiment 1 in that the gate current limiting circuit 3 composed of the voltage limiter 56, the current limiter 17, and the gate capacitance adjuster 13 is connected to the input side of the drive voltage amplitude limiting circuit 4. The drive voltage amplitude limiting circuit 4 controls the potential Vg at the output point 12 of the gate drive voltage generator 30 to be the potential at the output side of the gate current limiting circuit 3. The voltage gain of the buffer circuit 40 is described to be one in Embodiment 2, however, the gain may not be one, and by adjusting the amplitude of the signal input to the buffer circuit 40 by a factor corresponding to the gain of the buffer circuit 40 and by adjusting the breakdown voltages of the Zener diode 5 and the Zener diode 6 of the voltage limiter 56, characteristics similar to those in FIG. 3 can be obtained. The second embodiment is effective when applied in a case in which the buffer circuit 40 has a frequency characteristic in which a large gain cannot be obtained in a high-frequency region. In this case, as shown in FIG. 6, a capacitor C1 is connected to the gate current limiting circuit 3. In Embodiment 2, the details of the operation of the drive circuit 2 in response to the change in the characteristics of the switching element 1 at the ON time and the OFF time are the same as those in Embodiment 1.

Even if a drive signal having an amplitude equal to or greater than the voltage in the first control power supply 7 and the second control power supply 8 is input to the input terminal 11, the amplitude of the input signal is limited to the voltage in the first control power source 7 and the second control power source 8 by the diodes 9 and 10. When the drive timing signal at the ON time is input, the voltage of the gate capacitance adjuster 13 is instantaneously raised to Vth due to the Zener diode 5 and the Zener diode 6 of the voltage limiter 56. At this time, since the gate capacitance adjuster 13 is charged by the current passing through the capacitor C1, the rise thereof is steep. The buffer circuit 40 amplifies a current and raises the potential Vg at the output point 12 of the gate drive voltage generator 30 to Vth. Thereafter, since the gate capacitance adjuster 13 is charged through the current limiter 17, dv/dt of the gate capacitance adjuster 13 is controlled, and the buffer circuit 40 increases the voltage Vg at the output point 12 of the gate drive voltage generator 30 in response to the voltage of the gate capacitance adjuster 13.

With this configuration, even when a signal having a large amplitude is input, the dVge/dt is controlled even if the transfer characteristics of the switching element 1 changes, so that the gate drive voltage generator 30 controls the gate current so as to suppress a change in the trade-off when the temperature or the switching current changes, as in Embodiment 1. At this time, since the change depending on the magnitude of the current or the element temperature at the time of switching in the potential difference between the potential Vg at the output point 12 of the gate drive voltage generator 30 and the potential Vge at the gate terminal 101 is not large, the temperature and current dependence in the magnitude of the gate current that is adjusted by the gate resistance Rg can be reduced. Further, by connecting the capacitor C1 in parallel with the current limiter 17, a high-frequency gain of the drive circuit 2 can be increased, and thus the frequency characteristics of the gain of the drive circuit 2, in relation to the rising time of the voltage Vg at the output point 12 of the gate drive voltage generator 30, etc., can be compensated.

Embodiment 3

Figure 7:
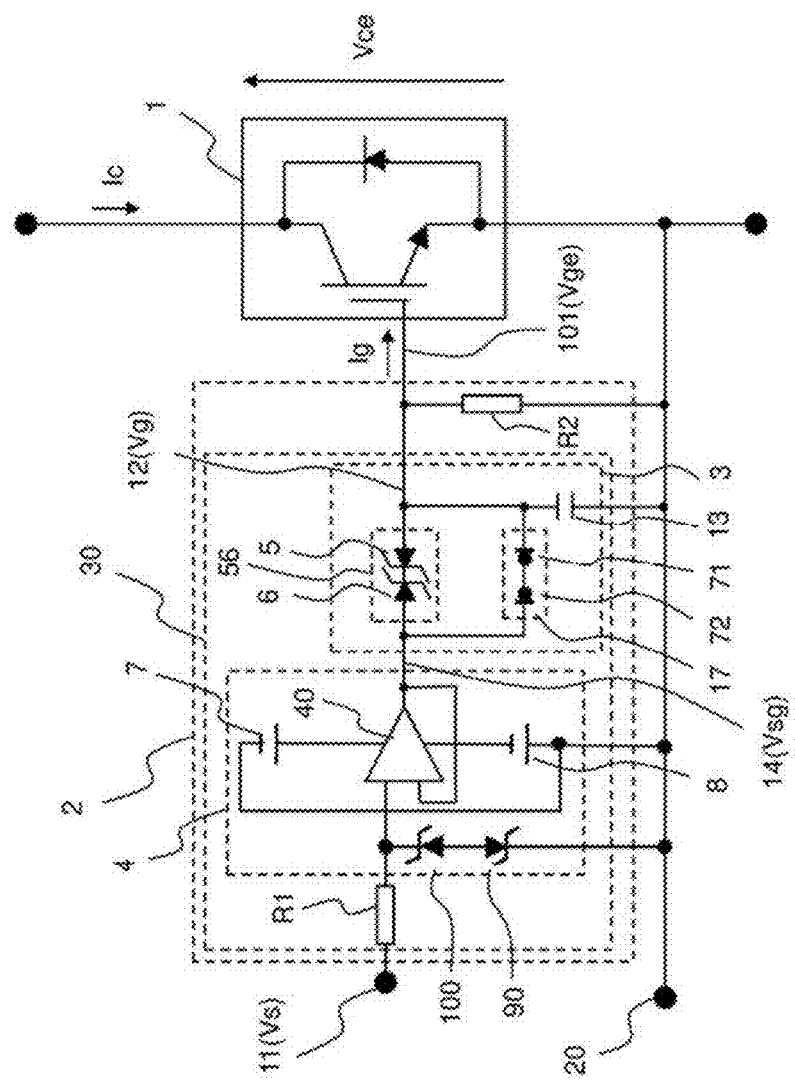
FIG. 7 is a circuit diagram showing a configuration of a drive circuit of a power semiconductor element according to Embodiment 3.

FIG. 7 is a circuit diagram showing a configuration of a drive circuit of a power semiconductor element according to Embodiment 3. Embodiment 3 is different from Embodiment 1 in that a resistor R1, and a Zener diode 90 and a Zener diode 100 that are connected in series with their polarities reversed are used as a clamping circuit for the input voltage of the buffer circuit 40, and in that a connected member in which two constant current diodes including a constant current diode 71 and a constant current diode 72 are connected in series with their polarities reversed is used as a current limiter 17 connected in parallel with the voltage limiter 56.

The Zener diode 90 and the Zener diode 100 limit the amplitude of the signal input to the buffer circuit 40 to be constant even if the amplitude of the drive timing signal Vs input to input terminal 11 changes. The same constant current value is used for the two constant current diodes that constitute the current limiter 17. Note that, it is also acceptable to use different constant current values for the constant current diode 71 for limiting the current at the ON time and for the constant current diode 72 for limiting the current at the OFF time to make a difference in the switching speed between the ON time and the OFF time. Although, in the gate current limiting circuit 3, the gate capacitance adjuster 13 is connected between the gate and the emitter of the switching element 1, the gate capacitance adjuster 13 adjusts the speed at the time of switching, and thus a configuration in which the gate capacitance adjuster 13 is removed and only the gate of the switching element 1 may be charged is also acceptable. In FIG. 7, the buffer circuit 40 is configured to use an operational amplifier and the output voltage of the operational amplifier is fed back, but the output voltage of the buffer circuit 40 may be controlled by using a buffer circuit that uses a complementary transistor or the like or an amplifier circuit or the like that amplifies the input signal. In FIG. 7, the voltage limiter 56 is composed of two Zener diodes, namely the Zener diode 5 and the Zener diode 6, connected in series with their polarities reversed. By combining the Zener diodes using not only an element having the breakdown voltage of 5.6 V or higher whose temperature coefficient of the breakdown voltage is positive, but also an element having the breakdown voltage of 5.6 V or lower, and thus with a plurality of the Zener diodes, they can be configured such that the change in the breakdown voltage with respect to the temperature change is adjusted to the change in the transfer characteristics of the switching element 1 with respect to the temperature change.

In Embodiment 3, when the ON signal as the drive timing signal Vs is input to the input terminal 11, the buffer circuit 40 outputs the potential of the first control power supply 7. When the ON signal is input, the voltage of the gate capacitance adjuster 13 is instantaneously raised to the threshold voltage Vth of the switching element 1 due to the Zener diode 5 and the Zener diode 6, and thereafter the gate capacitance adjuster 13 is charged by the current limiter 17.

In Embodiment 3, since the magnitude of the gate current in the region above Vth is controlled by the current limiter 17, the gate current does not change due to the potential difference between the output Vsg of the buffer circuit 40 and the potential Vge of the gate terminal 101, so that the switching speed is controlled to be constant. In the conventional constant-current drive, a delay time that is from the time the drive timing signal is input up to the time the switching element is driven occurs in the case where a negative bias is applied or the potential difference between the gate voltage and Vth is large when Vth is large and at the OFF time. In contrast, as in Embodiment 1 or Embodiment 2, in Embodiment 3, the output Vg of the gate drive voltage generator 30 adaptively changes so as to shorten the delay time in accordance with the change in the element characteristics, so that the dead time required at the time of switching can be shortened. By shortening the dead time, errors in the output voltage and current of the switching power supply due to the dead time can be reduced. Further, by configuring each of the Zener diode 5 and the Zener diode 6 such that a plurality of Zener diodes is connected in series, it is possible to adjust the change in the breakdown voltage to match the change in the transfer characteristics of the switching element 1 with respect to the temperature change. Thus, the gate current limiting circuit 3 which is adaptive to the temperature change can be implemented by combining the temperature characteristics of the Zener diodes 5, 6 and the switching element 1, or the deviations of their temperature changes, etc. The configuration shown in FIG. 7 in which the Zener diode 90 and the Zener diode 100 are provided at the input side and the configuration in which two constant current diodes are used as the current limiter 17 can be applied to other embodiments.

Embodiment 4

Figure 8:
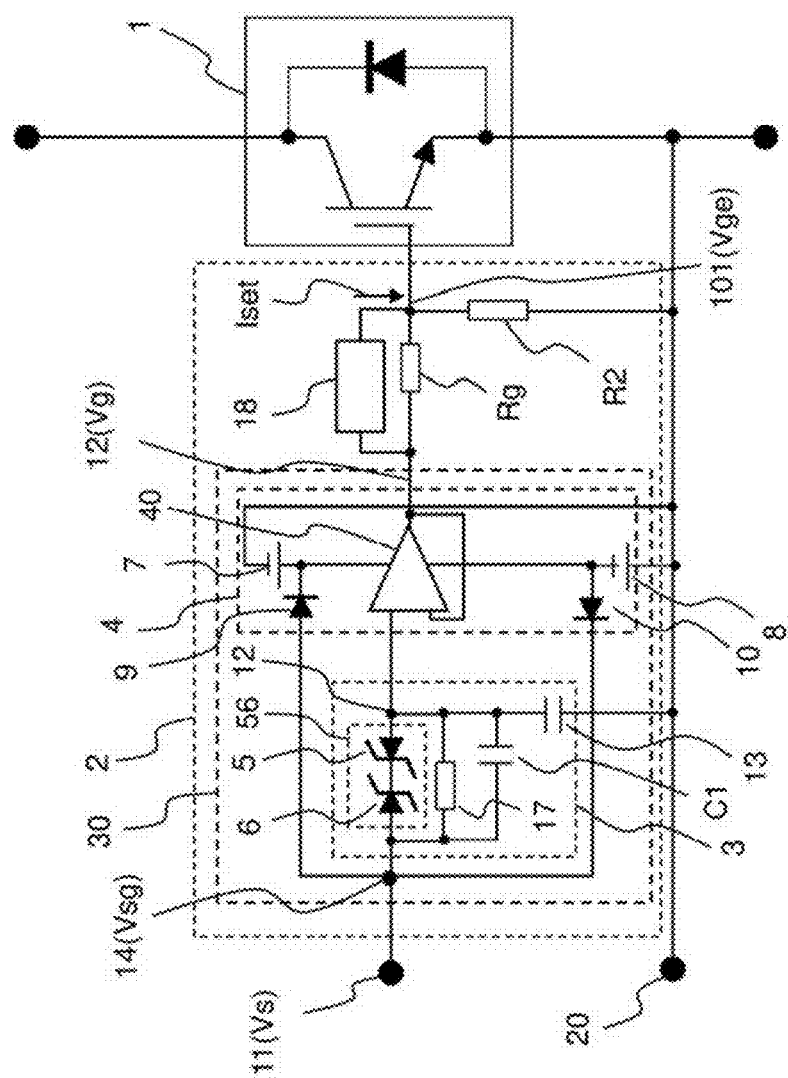
FIG. 8 is a circuit diagram showing a configuration of a drive circuit of a power semiconductor element according to Embodiment 4.

FIG. 8 is a circuit diagram showing a configuration of a drive circuit of a power semiconductor element according to Embodiment 4. In Embodiment 4, a gate voltage corrector 18 is connected in parallel with the gate resistor Rg. The gate voltage corrector 18 detects the output voltage Vg of the gate drive voltage generator 30 and outputs a correction current Iset so as to correct the gate voltage in accordance with the magnitude of Vg. The other configuration is the same as that of Embodiment 2 shown in FIG. 6 in that the gate current limiting circuit 3 is provided on the input side of the drive voltage amplitude limiting circuit 4.

Figure 9:
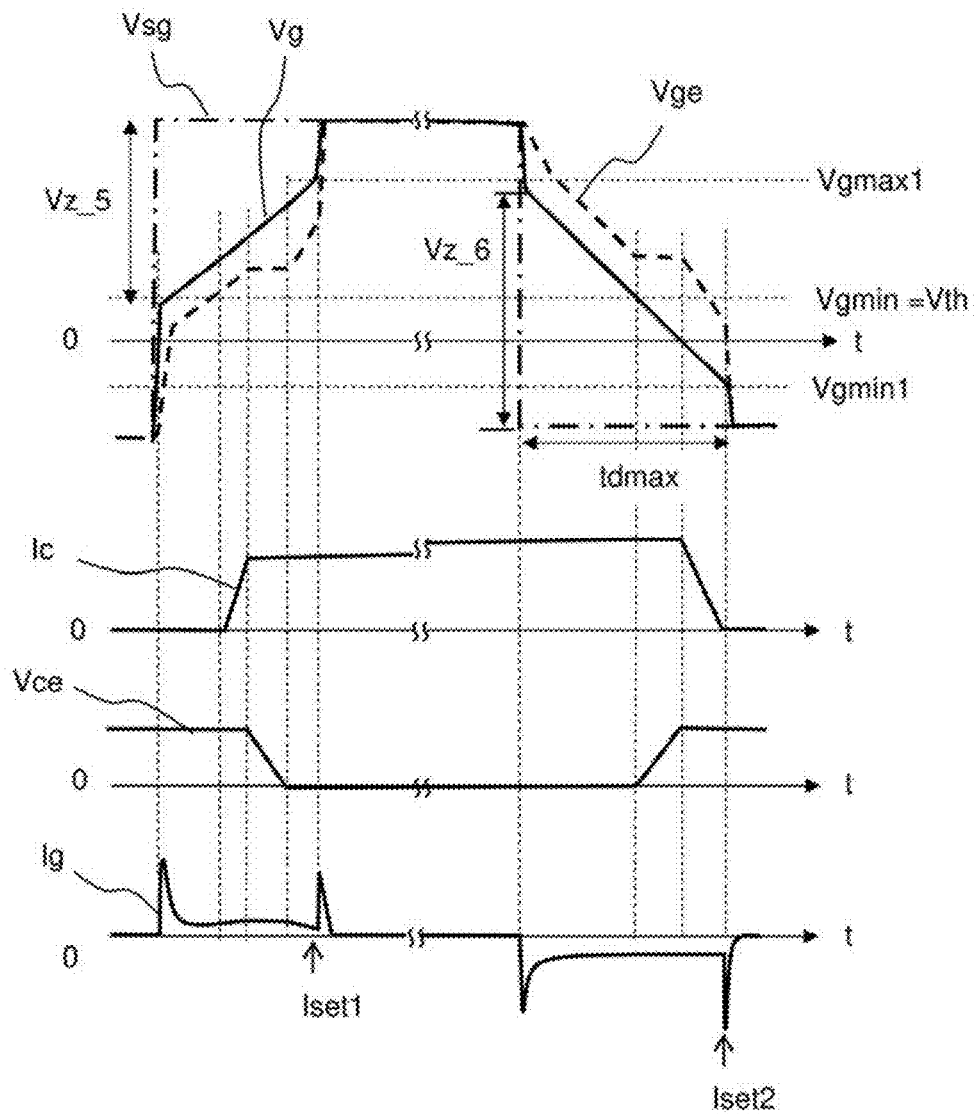
FIG. 9 is a diagram for describing operation of the drive circuit of the power semiconductor element according to Embodiment 4.

FIG. 9 is a diagram showing changes over time in the voltage and current of each part for describing operation of the circuit shown in FIG. 8. In the operation of the ON time and the OFF time, the operation until the gate voltage reaches the mirror voltage is the same as that in Embodiment 2. At the ON time, when the potential Vg of the output of the gate drive voltage generator 30 becomes equal to or greater than a third threshold voltage Vgmax1, the gate voltage corrector 18 outputs a correction current Iset1 in the direction of increasing the gate current to forcibly turns on the switching element 1. The third threshold voltage Vgmax1 is set so as to be not lower than the gate voltage corresponding to the maximum allowable value of the collector current that is determined by the specifications of the switching element 1, etc., and is set so as to be within a range of the operation time and a range of the current in which the switching element is not destroyed even if the switching element 1 is operated in a saturated state during the gate voltage Vge rising from the threshold voltage Vth to the Vgmax1. As a result, the voltage Vce between the emitter and the collector can be lowered after a certain period of time elapses in the case of overcurrent or the like, and it is possible to prevent the switching element 1 from failing due to a damage caused by operation in the active region at the time of switching.

At the OFF time, when the potential Vg of the output of the gate drive voltage generator 30 becomes equal to or lower than a fourth threshold voltage Vgmin1, the gate voltage corrector 18 outputs a correction current Iset2 in the direction of discharging the charge of the gate electrode to forcibly turns off the switching element 1. The fourth threshold voltage Vgmin1 is set to be equal to or lower than the threshold voltage Vth of the switching element 1, and the switching element 1 is reliably turned off at this voltage, so that the delay time tdmax of the driving can be shortened and the dead time can be shortened. Since it is considered that the potential difference between the potential Vge of the gate electrode and the potential Vg of the output of the gate drive voltage generator 30 becomes small and thus the switching is delayed, the gate voltage Vge is reduced by a large amount to reliably turn off the switching element 1. At this time, if the gate voltage Vge is sharply decreased in the vicinity of Vth, the recovery noise becomes large, and therefore, in consideration of the time to be turned off, the fourth threshold voltage Vgmin1 is set to a voltage that is equal to or lower than Vth with a margin considered. The correction current Iset2 is also controlled such that the dVge/dt in the vicinity of Vth becomes smaller than a predetermined value to prevent the gate current Ig from becoming too large as a measure for the recovery, thereby limiting the current change rate di/dt of Ic. As a result, a peak value of the recovery current can be reduced, so that the switching noise can be suppressed. Since the rate of change of Ig of the IGBT, which is the switching element 1, decreases in the vicinity of Vth, by making the rate of change dVge/dt of the gate voltage Vge constant using the constant current diodes as the current limiter 17 as described in Embodiment 3, the peak value of the recovery current can be made small. Further, in the case where a MOSFET is used as the switching element 1, the gate voltage corrector 18 controls the rate of change dVge/dt of the gate voltage Vge in the vicinity of Vth to be small using Iset, and thus the peak value of the recovery current or the peak value of the abnormal voltage generated in the collector-emitter voltage Vce can be reduced.

The gate voltage corrector 18 is not limited to the configuration of Embodiment 4, and can be applied to the circuits in the other embodiments, and when it is applied, the effects in the operation in the vicinity of the third threshold voltage Vgmax1, the fourth threshold voltage Vgmin1, and Vth described above can be obtained.

Embodiment 5

Figure 10:
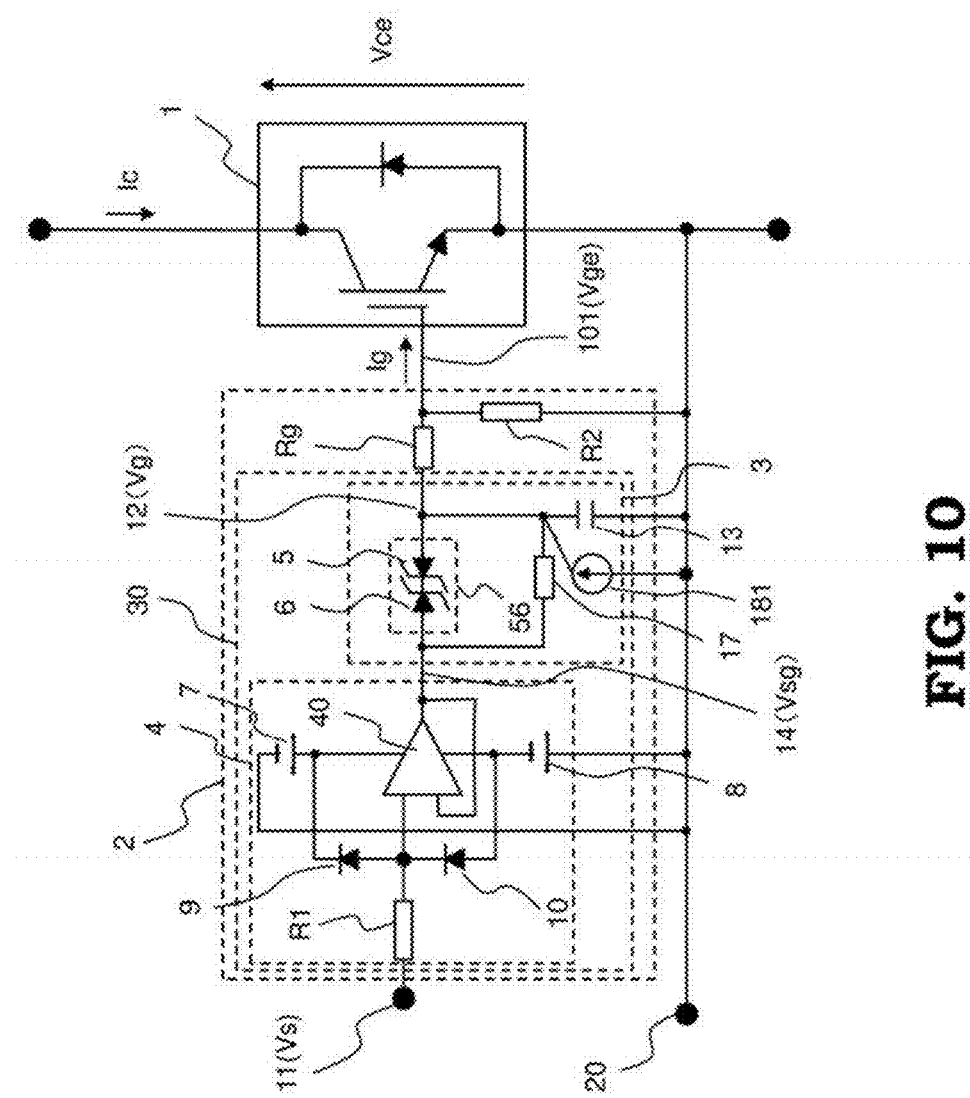
FIG. 10 is a circuit diagram showing a configuration of a drive circuit of a power semiconductor element according to Embodiment 5.

FIG. 10 is a circuit diagram showing a drive circuit of a power semiconductor element according to Embodiment 5. The drive circuit of the power semiconductor element according to Embodiment 5 is provided with a current source 181 (also referred to as a gate voltage corrector 181) which controls a current flowing through the gate electrode on the basis of external signals such as the temperature of the switching element 1, the magnitude of the switching current, and a measurement result of a high-frequency current at the time of switching. The current source 181 (gate voltage corrector) may be provided at the same position as the gate voltage corrector 18 shown in FIG. 8 in Embodiment 4. The gate voltage corrector 18 in Embodiment 4 is configured to control the current flowing through the gate electrode on the basis of the output voltage of the gate drive voltage generator 30. As described above, the current source 181 (gate voltage corrector) in Embodiment 5 controls the current flowing through the gate electrode by changing the output current thereof on the basis of the external signals such as the temperature of the switching element 1, the magnitude of the switching current, and the measurement result of the high-frequency current at the time of switching. By changing the current of the current source 181, the rate of change dVg/dt of the output voltage Vg of the gate drive voltage generator 30 can be adjusted.

Figure 11A:
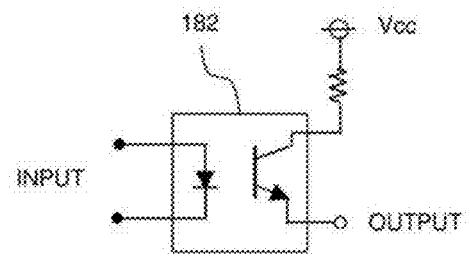
FIGS. 11A and 11B each illustrate an example of a current source as a gate voltage corrector in the drive circuit of the power semiconductor element according to Embodiments 4, 5, and 6.
Figure 11B:
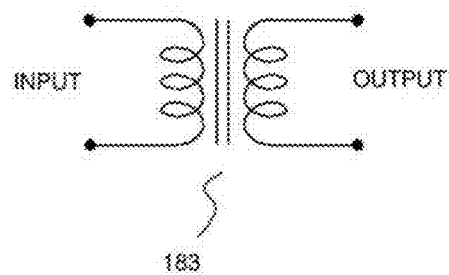

The current source 181 may be any current source such as a photocoupler, a constant current source, or a resistor connected to a voltage source, provided that the current value to be output can be changed. As the current source 181, for example, a current source configured to supply a current via a photocoupler 182 as shown in FIG. 11A can be used. By supplying a current to INPUT, a current can be taken out from OUTPUT which is isolated from the INPUT side. To output a negative current, the collector side of the phototransistor is used as OUTPUT, and a negative power supply is connected to the emitter side. In order to output both positive and negative currents, a photocoupler for outputting the positive current and a photocoupler for outputting the negative current may be connected in parallel. The current sources described above can also be used as the gate voltage corrector 18 in Embodiment 4. When the current source 181 is used as an AC current source as described later in Embodiment 6, an AC current source configured to supply a current via a transformer 183 as shown in FIG. 11B can also be used.

In embodiments 1 to 4, even if the temperature of the switching element 1 or the magnitude of the switching current changes and thus the mirror voltage changes, the gate current is controlled to be constant by controlling dVg/dt, so that the loss at the time of switching is controlled not to be changed. However, a problem of the delay time that is from the time the drive timing signal Vs is input up to the time the switching is made arises owing to the control of dVg/dt. For example, when the switching element 1 is used in a switching power supply driven by a constant voltage, there is a problem that a difference occurs in the time from the input of the drive timing signal up to the completion of the switching due to a change in the mirror voltage, so that an error occurs in the output voltage of the switching power supply.

Also in Embodiment 5, by limiting the output current, the current limiter 17 limits the amount of change of the output 12 which is at the connection point between the current limiter 17 and the voltage limiter 56, that is, the amount of change in the potential Vg of the gate capacitance adjuster 13. Further, the voltage limiter 56 limits the voltage range in which the current limiter 17 limits the current to the gate capacitance adjuster 13. The voltage limiter 56 is composed of a serially connected member in which two Zener diodes 5 and 6 are connected in series with their polarities reversed. With this configuration, the voltage can be limited in either direction of the current. Also, as shown in FIG. 2, the voltage can be limited in either direction of the current by using the voltage limiter 56 in which two of the serially connected member in which a Zener diode and a diode are connected in series with their polarities reversed are connected in parallel in the opposite direction to each other. However, a configuration as the voltage limiter 56 shown in FIG. 10 in which two Zener diodes are connected in series with their polarities reversed is simpler. The voltage limiter 56 is preferably disposed in the same module as the switching element 1 or in the same substrate so as to have an equivalent temperature to the switching element 1, and the configuration of the voltage limiter 56 shown in FIG. 10 is effective for this purpose.

In the circuit shown in FIG. 10, the gate capacitance adjuster 13 and the gate resistor Rg are connected in order to limit the magnitude of the gate current, but these two are not always necessary, and either one of them may not be provided. Further, when a constant part on the chip or within the element of the switching element 1 is available, both may not be provided.

Figure 12:
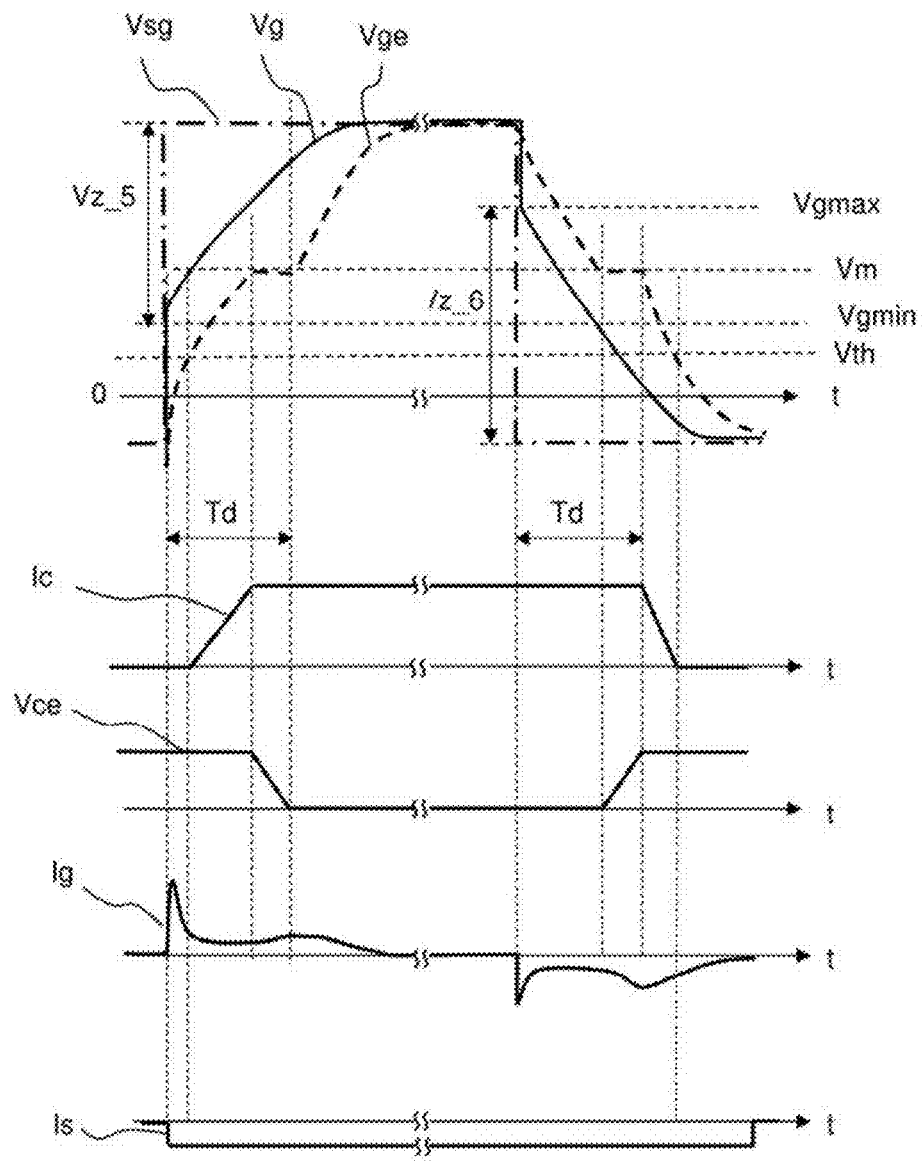
FIG. 12 is a first diagram illustrating operation of the drive circuit of the power semiconductor element according to Embodiment 5.

FIG. 12 is a diagram showing changes over time in the voltage and current of each part of the circuit shown in FIG. 10. In the uppermost part of FIG. 12, the dashed-dotted line indicates the potential Vsg at the output point 14 of the drive voltage amplitude limiting circuit 4, that is, at the input side of the gate current limiting circuit 3, the solid line indicates the potential Vg at the output point 12 of the gate drive voltage generator 30, and the broken line indicates the voltage Vge between the gate electrode and the emitter electrode of the switching element 1. Each of the potentials is indicated based on the potential of the emitter terminal 20 of the switching element 1. The second part of the diagram indicates the current flowing between the collector as the first main electrode and the emitter as the second main electrode of the switching element 1, that is, the collector current Ic, the third part of the diagram indicates the collector-emitter voltage Vce of the switching element 1, and the fourth part thereof indicates the gate current Ig of the switching element 1. Further, the fifth part thereof indicates current Is output from the current source 181.

When the ON signal as the drive timing signal Vs is input to the input terminal 11, a potential corresponding to the voltage Vcc of the first control power supply 7 is output to the output point 14 of the drive voltage amplitude limiting circuit 4 as shown by the dashed-dotted line. A value obtained by subtracting the breakdown voltage Vz_5 of the Zener diode 5 from Vcc when the drive timing signal Vs is at the ON time is defined as the first threshold voltage Vgmin, and the value of Vz_5 is set so that Vgmin is equal to or higher than the threshold voltage Vth of the switching element 1. With this setting, at the ON time, that is, at the time of rising of the drive timing signal Vs, the output voltage Vg of the gate current limiting circuit 3 rises due to the Zener diode 5 and the Zener diode 6 up to the potential Vgmin that is equal to or higher than the threshold voltage Vth of the switching element 1, as shown by the solid line. When the output voltage Vg of the gate current limiting circuit 3 is equal to or higher than the first threshold voltage Vgmin, the potential difference between the input side and the output side of the gate current limiting circuit 3 becomes equal to or lower than the voltage Vz_5 set by the Zener diode 5, so that the gate capacitance adjuster 13 is charged through the current limiter 17.

At this time, the change in the output voltage Vg of the gate current limiting circuit 3 is limited by the time constant of the current limiter 17 composed of a resistor and the gate capacitance adjuster 13. When the voltage between the gate terminal and the emitter terminal of the switching element 1, that is, the gate voltage Vge, becomes equal to or higher than the threshold voltage Vth, the switching element 1 starts to turn on, and the current Ic to be transmitted increases as the gate voltage Vge increases, and when the current Ic reaches a required current value, the switching element 1 shifts into the mirror period. As described above, since the rate of change dVge/dt of the gate voltage Vge is controlled, the delay time Td that is from the time when the drive timing signal Vs becomes the ON signal up to the time when actual switching starts becomes longer, for example, as the current at the time of switching is larger and the mirror voltage Vm is larger. In contrast, at the OFF time, since the rate of change dVge/dt of the gate voltage Vge is controlled, the delay time from the time of the OFF signal input becomes short under the above condition.

As described above, since the mirror voltage Vm changes depending on the condition such as the switching current or the temperature, the delay time Td that is from the time when the drive timing signal Vs becomes the ON signal up to the actual switching starts changes. Therefore, a problem arises in that a large difference occurs between the switching time designated by the drive timing signal Vs and the actual switching time. To solve the above problem, in the present embodiment, the current source 181 for adjusting the dVge/dt is provided.

FIG. 12 shows a case in which the value of the current Is of the current source 181 is negative when the mirror voltage is a certain value Vm. With this setting, the amount of charge per unit time charged to the gate electrode at the ON time is reduced as compared with the case without the current source 181, and therefore the rise speed is decreased. In contrast, at the OFF time, since the amount of charge per unit time discharged from the gate electrode increases, the fall speed is increased. In this example, by adjusting the current Is output from the current source 181, the switching delay time Td is made equal at the ON time and the OFF time.

Figure 13:
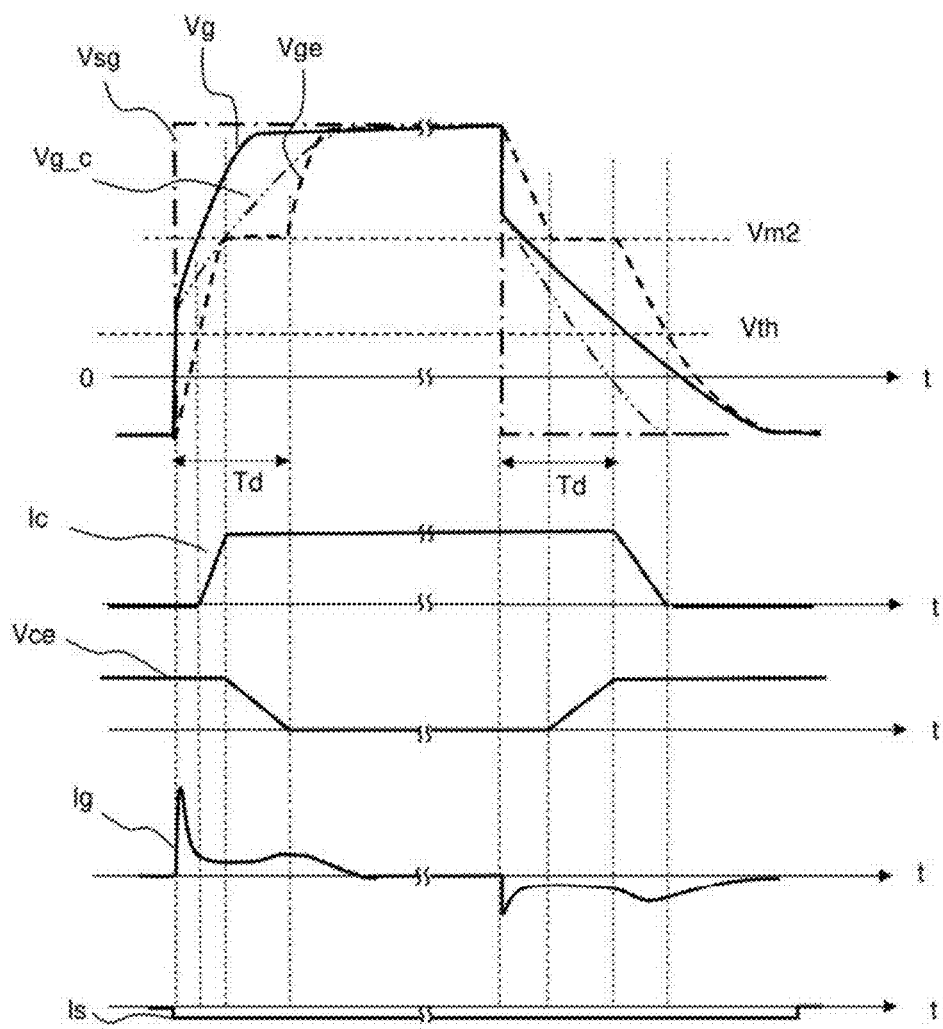
FIG. 13 is a second diagram illustrating operation of the drive circuit of the power semiconductor element according to Embodiment 5.

FIG. 13 shows a voltage or current waveform of each part when the mirror voltage increases up to Vm2 due to an increase in the switching current or a change in temperature as compared with the case shown in FIG. 12. In FIG. 13, for the comparison of the change of Vg, Vg in the case of FIG. 12 is shown as Vg_c. When the mirror voltage increases, if the value of current output from the current source 181 is not adjusted, the rise-time becomes longer at the ON time and conversely, the fall-time becomes shorter at the OFF time. In FIG. 13, the negative value of current output from the current source 181 is decreased as compared with the case shown in FIG. 12. By reducing the negative value of current output from the current source 181, as shown in FIG. 13, the rate of change dVg/dt of Vg at the ON time becomes larger than the rate of change of Vg_c shown for the comparison, and thus the rise-time is shortened and the delay time Td at the ON time can be made equal to that in the case shown in FIG. 11. At the OFF time, the rate of change dVg/dt of Vg becomes smaller than the rate of change of Vg_c shown for the comparison, the rise-time increases, and the delay time at the OFF time can be made equal to that in the case shown in FIG. 12.

Figure 14:
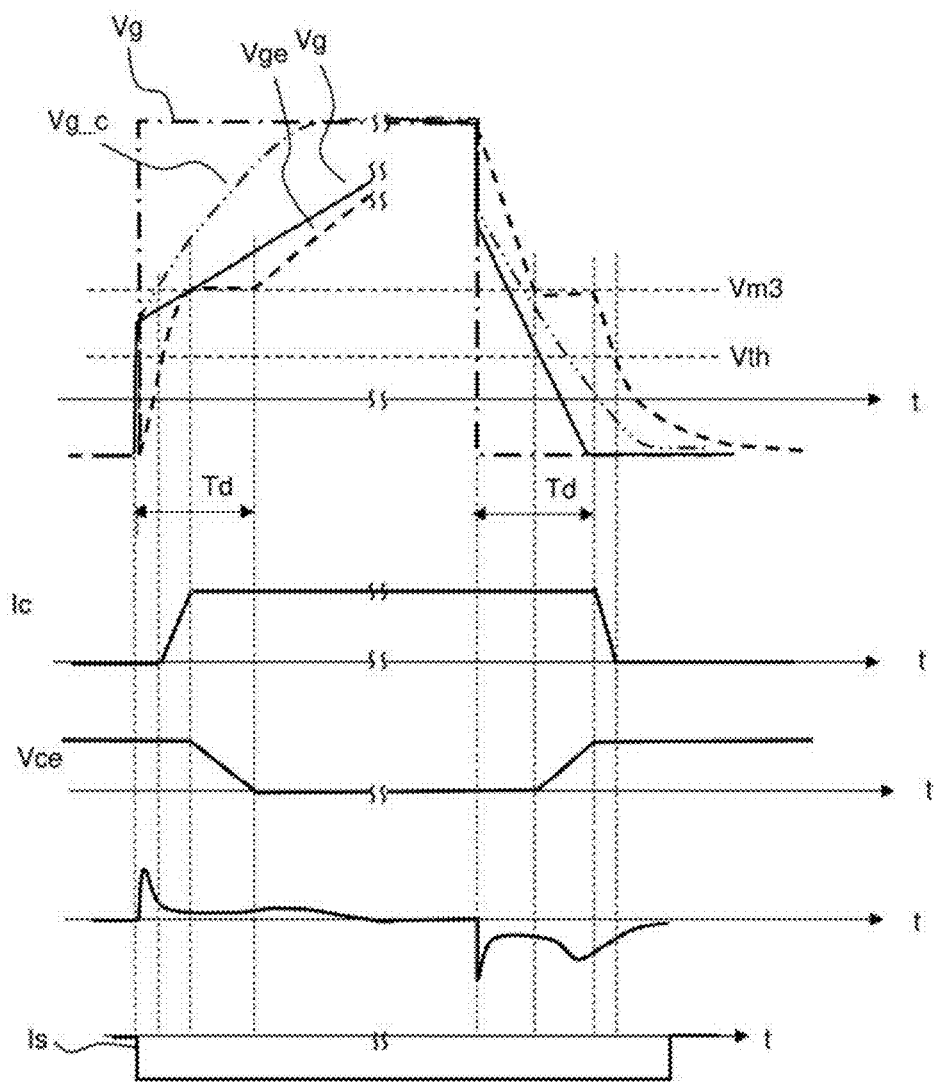
FIG. 14 is a third diagram illustrating operation of the drive circuit of the power semiconductor element according to Embodiment 5.

FIG. 14 shows a voltage or current waveform of each part when the mirror voltage decreases down to Vm3 due to a decrease in the switching current or a change in temperature as compared with the case shown in FIG. 12. In FIG. 14, for the comparison of the change of Vg, Vg in the case of FIG. 12 is shown as Vg_c. When the mirror voltage decreases, the rise-time becomes shorter at the ON time, and conversely, the fall-time becomes longer at the OFF time unless the value of current output from the current source 181 is adjusted. In FIG. 14, the negative value of current output from the current source 181 is increased as compared with the case shown in FIG. 12. By increasing the negative value of current output from the current source 181, the rate of change dVg/dt of Vg at the time of turning on becomes smaller than the rate of change of Vg_c shown as a comparison as shown in FIG. 14, and thus the rise-time increases, and the delay time Td at the ON time can be made equal to that in the case shown in FIG. 12. At the OFF time, the rate of change dVg/dt of Vg becomes larger than the rate of change of Vg_c shown for the comparison, the rise-time decreases, and the delay time at the OFF time can be made equal to the case shown in FIG. 12. In this way, it is possible to control the delay times to be equal by the current source 181 even if the mirror voltage changes.

In this way, in the present embodiment, the problem that a large difference occurs between the switching time designated by the drive timing signal Vs and the actual switching time can be solved by changing the value of current output from the current source 181 to adjust dVg/dt. That is, when the magnitude of the mirror voltage changes due to a change in temperature or current of the switching element, the value of current output from the current source 181 is changed in accordance with the change in the temperature or current of the switching element so that the delay time at the ON time can be equal to the delay time at the OFF time. As a result, the delay times due to the change in the mirror voltage associated with the switching current or the temperature of the switching element 1 are adjusted so that the delay times at the ON time and the OFF time can be controlled to be equal with each other.

Note that, in the above description, the value of current output from the current source 181 is only negative, but since the current source 181 is provided to control the charging and discharging of electric charges, the current is not limited to be negative and there may be a case in which a positive current needs to be output in response to a change in Vm, and thus it may be only negative or only positive.

Embodiment 6

Figure 15:
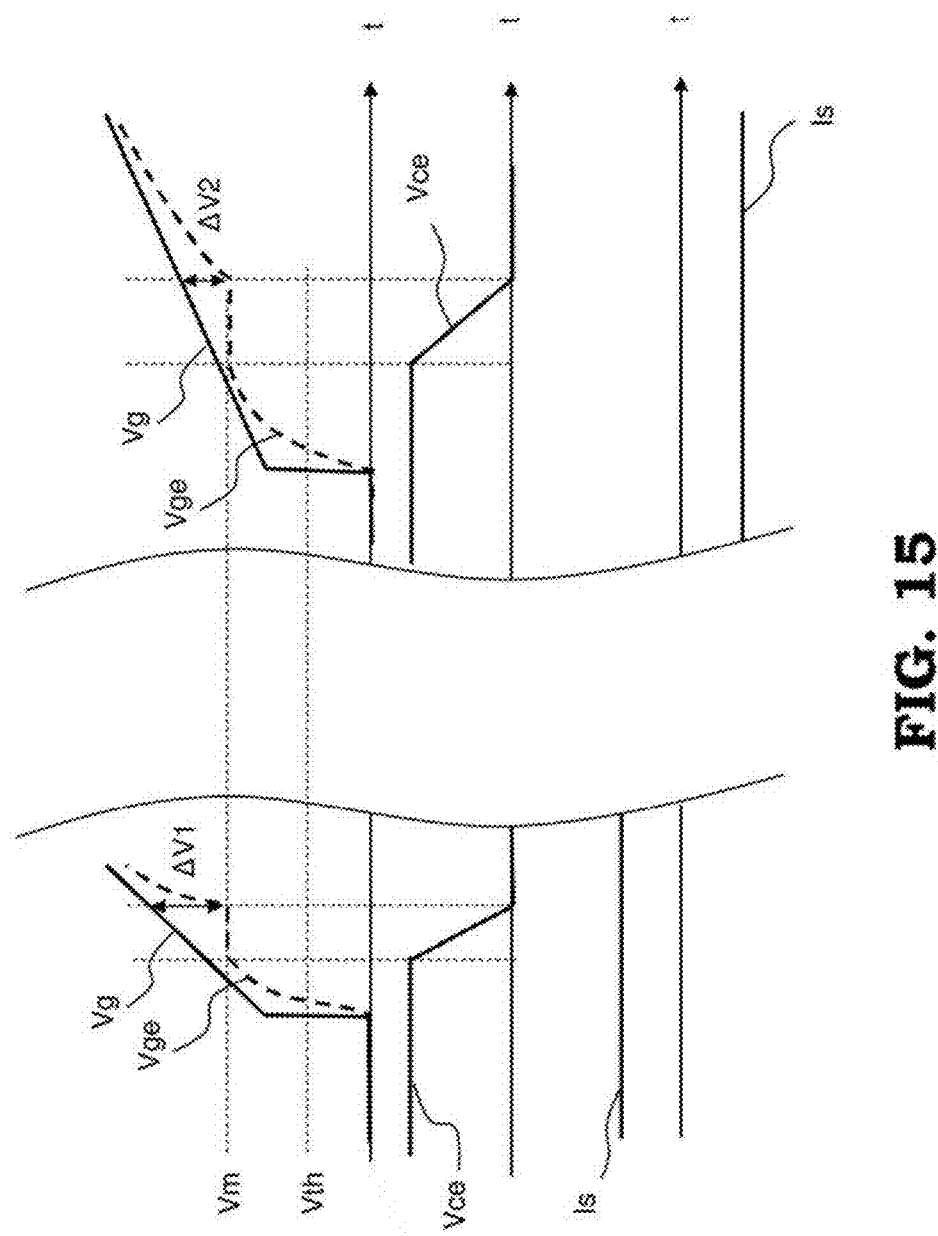
FIG. 15 is a diagram illustrating operation of a drive circuit of a power semiconductor element according to Embodiment 6.

FIG. 15 is a diagram for a waveform of each part showing operation of a drive circuit of a power semiconductor element according to Embodiment 6. The configuration of the drive circuit is the same as that shown in FIG. 10. Embodiment 6 differs from Embodiments 4 and 5 in that the current source 181 changes its magnitude without synchronizing the timing of switching.

Although a case where the gate capacitance adjuster 13 is connected will be described below, the gate capacitance adjuster 13 may be omitted and thus the output voltage Vg may be directly applied to the gate of the switching element 1. The diagram shown at the left in FIG. 15 is a diagram when the current source 181 outputs a positive current. The slope of the output voltage Vg of the gate current limiting circuit 3 at the ON time becomes large due to the current of the current source 181. When the gate voltage Vge enters into the mirror period, the potential difference ΔV1 between Vge and Vg is controlled to increase. As a result, a large mirror current is supplied, so that the rate of change dVce/dt of the collector-emitter voltage at the time of switching is controlled to be large. Therefore, the switching time at the time of switching is shortened, the loss is reduced, and a high-frequency current in a high-frequency band is generated at the time of switching. In contrast, when the current source 181 outputs a negative current as shown in the diagram at the right in FIG. 15, the rate of change dVg/dt of Vg is limited to be small, and the potential difference ΔV2 between Vge and Vg is controlled to be small. As a result, dVce/dt is controlled to be small, so that the switching noise generated at this time is limited within a low frequency band.

In Embodiment 6, the operation shown at the left diagram and the operation shown at the right diagram in FIG. 15 are repeated. As shown in the lines of Is in FIG. 15, the current source 181 alternately outputs the positive current and the negative current on the time axis; that is, the current source 181 uses an alternating current source. The current source 181 alternately outputs the positive current and the negative current with a change rate slower than the frequency of the drive timing signal Vs input to the input terminal 11. That is, the frequency of the alternating current output from the current source 181 is lower than the drive timing signal Vs.

In the above description, an example of the switching at the ON time is described. Also at the OFF time, the switching noise frequency at the OFF time is changed by changing the current output from the current source 181, which is the same as that at the ON time.

Figure 16:
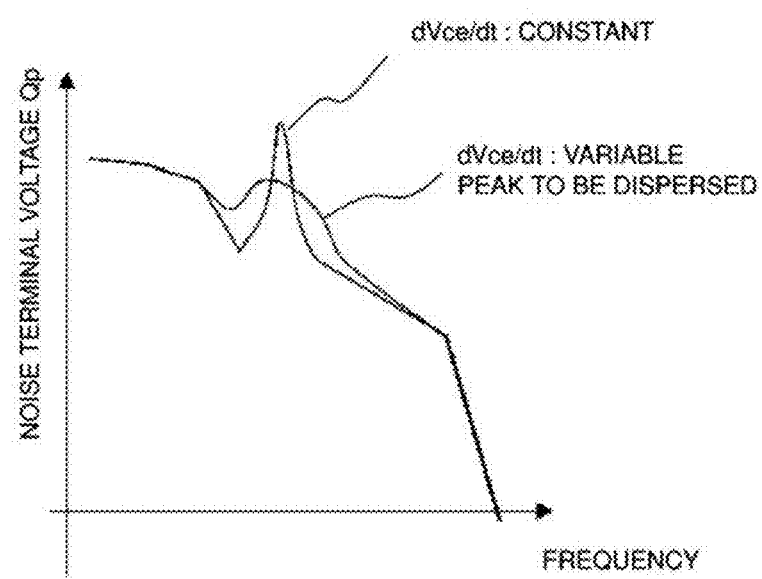
FIG. 16 is a diagram for describing effects caused by the operation of the drive circuit of the power semiconductor element according to Embodiment 6.

In order to describe an effect when this control is adapted, frequency characteristics of a noise terminal voltage Op of the switching power supply are shown in FIG. 16. When dVce/dt described in Embodiment 1 is controlled to be a constant value, current dependence and temperature dependence of dVce/dt are reduced, so that a noise peak occurs at a specific frequency as shown by the curve indicated by "dVce/dt: constant". In contrast, since the frequency band of the noise is changed by repeating the operation shown at the left and right diagrams in FIG. 15, the noise peak can be dispersed as shown by the curve "dVce/dt: variable" in FIG. 16. In the case of this control, for an effect, the noise peak can be controlled by the frequency and its magnitude of the alternating current output from the current source 181 and a repetition frequency at which the frequency is changed. That is, by measuring the noise terminal voltage Op of the switching power supply and controlling the AC frequency output from the current source 181 on the basis of the measured value, the frequency band in which the noise peak occurs can be adjusted to a desired frequency band.

Note that, although various exemplary embodiments and examples are described in the present application, various features, aspects, and functions described in one or more embodiments are not inherent in a particular embodiment, and can be applicable alone or in their various combinations to each embodiment. Accordingly, countless variations that are not illustrated are envisaged within the scope of the art disclosed herein. For example, the case where at least one component is modified, added or omitted, and the case where at least one component is extracted and combined with a component in another embodiment are included.

DESCRIPTION OF REFERENCE NUMERALS AND SIGNS switching element, 2 drive circuit, 3 gate current limiting circuit, 4 drive voltage amplitude limiting circuit, 5, 6 Zener diode, 7 first control power supply, 8 second control power supply, 11 input terminal, 12 output point of gate drive voltage generator, 13 gate capacitance adjuster, 17 current limiter, 18, 181 gate voltage corrector, 20 emitter terminal, 30 gate drive voltage generator, 56 voltage limiter, 101 gate terminal, 182 photo coupler, 183 transformer, Vgmin first threshold voltage, Vgmax second threshold voltage, Vgmax1 third threshold voltage, Vgmin1 fourth threshold voltage, Vth threshold voltage

The invention claimed is:

1. A drive circuit of a power semiconductor element, comprising:
a gate drive voltage generator to generate, based on an ON/OFF drive timing signal input to an input terminal, a gate drive voltage to be applied to a gate electrode of a switching element having the gate electrode for controlling a main current that flows between a first main electrode and a second main electrode, wherein
the gate drive voltage generator includes a gate current limiting circuit in which a current limiter to limit a current and a voltage limiter to limit a magnitude of a voltage applied to both ends of the current limiter are connected in parallel.

2. The drive circuit of the power semiconductor element according to claim 1, wherein, when the drive timing signal becomes an ON signal, the voltage limiter increases an output voltage of the gate drive voltage generator up to a first threshold voltage, and after the output voltage of the gate drive voltage generator is increased to the first threshold voltage, the output voltage of the gate drive voltage generator is increased by a current flowing through the current limiter.

3. The drive circuit of the power semiconductor element according to claim 2, wherein the first threshold voltage is equal to or higher than a threshold voltage of the switching element.

4. The drive circuit of the power semiconductor element according to claim 1, wherein, when the drive timing signal becomes an OFF signal, the voltage limiter decreases an output voltage of the gate current limiting circuit to a second threshold voltage, and after the output voltage of the gate drive voltage generator is decreased to the second threshold voltage, the output voltage of the gate drive voltage generator is decreased by the current flowing through the current limiter.

5. The drive circuit of the power semiconductor element according to claim 1, wherein the voltage limiter has a positive slope with respect to a temperature change in a magnitude of a voltage to be limited.

6. The drive circuit of the power semiconductor element according to claim 1, wherein the voltage limiter is a connected member in which two Zener diodes are connected in series with their polarities reversed.

7. The drive circuit of the power semiconductor element according to claim 6, wherein one of the Zener diodes in at least one polarity includes a plurality of Zener diodes connected in series.

8. The drive circuit of the power semiconductor element according to claim 1, wherein the voltage limiter is disposed in the same environment with respect to a temperature change as that of the switching element.

9. The drive circuit of the power semiconductor element according to claim 1, wherein the current limiter is a connected member in which two constant current diodes are connected in series with their polarities reversed.

10. The drive circuit of the power semiconductor element according to claim 1, wherein the gate drive voltage generator includes a drive voltage amplitude limiting circuit provided with a first control power supply to limit a value of the gate drive voltage at an ON time and a second control power supply to limit a value of the gate drive voltage at an OFF time.

11. The drive circuit of the power semiconductor element according to claim 1, wherein a capacitor is connected between an output side of the gate current limiting circuit and the second main electrode.

12. The drive circuit of the power semiconductor element according to claim 1, further comprising a gate voltage corrector to control a current that flows through the gate electrode.

13. The drive circuit of the power semiconductor element according to claim 12, wherein the gate voltage corrector corrects a voltage of the gate electrode by controlling a current that flows through the gate electrode based on the output voltage of the gate drive voltage generator.

14. The drive circuit of the power semiconductor element according to claim 13, wherein the gate voltage corrector applies a current to flow through the gate electrode so that the voltage of the gate electrode becomes a voltage at which the switching element is forcibly turned on when the output voltage of the gate drive voltage generator becomes equal to or higher than a third threshold value after the drive timing signal becomes the ON signal.

15. The drive circuit of the power semiconductor element according to claim 13, wherein the gate voltage corrector applies a current to flow through the gate electrode so that the voltage of the gate electrode becomes a voltage at which the switching element is forcibly turned off when the output voltage of the gate drive voltage generator becomes equal to or less than a fourth threshold value after the drive timing signal becomes the OFF signal.

16. The drive circuit of the power semiconductor element according to claim 12, wherein the gate voltage corrector changes a current value to be output in response to a change in a mirror voltage of the switching element.

17. The drive circuit of the power semiconductor element according to claim 12, wherein the gate voltage corrector changes a current value to be output based on at least one of a temperature of the switching element and a value of the main current of the switching element.

18. The drive circuit of the power semiconductor element according to claim 12, wherein the gate voltage corrector is an alternating current source capable of outputting positive and negative currents.

19. The drive circuit of the power semiconductor element according to claim 18, wherein the switching element is connected as a switching element constituting a switching power supply, and at least one of a frequency and a current value of the alternating current source is determined based on a noise terminal voltage of the switching power supply.

* * * * *